United States Patent
Matsuo et al.

(10) Patent No.: US 11,411,575 B2
(45) Date of Patent: Aug. 9, 2022

(54) IRREVERSIBLE COMPRESSION OF NEURAL NETWORK OUTPUT

(71) Applicant: Kabushiki Kaisha Toshiba, Minato-ku (JP)

(72) Inventors: Takuya Matsuo, Kawasaki (JP); Wataru Asano, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 1094 days.

(21) Appl. No.: 15/898,341

(22) Filed: Feb. 16, 2018

(65) Prior Publication Data
US 2019/0058489 A1 Feb. 21, 2019

(30) Foreign Application Priority Data

Aug. 21, 2017 (JP) .............................. JP2017-158389

(51) Int. Cl.
*G06N 3/04* (2006.01)
*G06N 3/08* (2006.01)
*G06N 5/04* (2006.01)
*H03M 7/30* (2006.01)

(52) U.S. Cl.
CPC ................ *H03M 7/30* (2013.01); *G06N 3/04* (2013.01); *G06N 3/0454* (2013.01); *G06N 3/08* (2013.01); *G06N 3/084* (2013.01); *G06N 5/046* (2013.01); *H03M 7/3059* (2013.01)

(58) Field of Classification Search
CPC .......... G06N 3/04; G06N 3/0454; G06N 3/08; G06N 3/084; G06N 5/046; H03M 7/30; H03M 7/3059
See application file for complete search history.

(56) References Cited

U.S. PATENT DOCUMENTS

| | | | |
|---|---|---|---|
| 6,236,749 B1 | 5/2001 | Satonaka et al. | |
| 2016/0259995 A1 | 9/2016 | Ishii et al. | |
| 2018/0075347 A1* | 3/2018 | Alistarh | G06N 3/084 |
| 2018/0253635 A1* | 9/2018 | Park | G06F 7/535 |

FOREIGN PATENT DOCUMENTS

| | | |
|---|---|---|
| JP | 7-184062 A | 7/1995 |
| JP | 2002-511175 A | 4/2002 |
| JP | 2016-029568 | 3/2016 |

(Continued)

OTHER PUBLICATIONS

Dryden, Nikoli, et al. "Communication quantization for data-parallel training of deep neural networks." 2016 2nd Workshop on Machine Learning in HPC Environments (MLHPC). IEEE, 2016. (Year: 2016).*

(Continued)

*Primary Examiner* — Hal Schnee
(74) *Attorney, Agent, or Firm* — Oblon, McClelland, Maier & Neustadt, L.L.P.

(57) ABSTRACT

According to an embodiment, an information processing apparatus includes a computing unit and a compressing unit. The computing unit is configured to execute computation of an input layer, a hidden layer, and an output layer of a neural network. The compressing unit is configured to irreversibly compress output data of at least a part of the input layer, the hidden layer, and the output layer and output the compressed data.

8 Claims, 7 Drawing Sheets

(56) References Cited

FOREIGN PATENT DOCUMENTS

| JP | 2017-97718 A | 1/2017 |
| JP | 2017-33529 A | 2/2017 |
| JP | 2017-62781 A | 3/2017 |
| WO | WO 2016/118257 A1 | 7/2016 |

OTHER PUBLICATIONS

Yu-Hsin Chen, et al., "Eyeriss: An Energy-Efficient Reconfigurable Accelerator for Deep Convolutional Neural Networks," IEEE Journal of Solid-State Circuits, vol. 52, No. 1, Jan. 2017, pp. 127-138.
"DNN Feature Map Compression Using Learned Representation Over GF (2)," ICLR 2018, pp. 1-10.
Ryu Takeda, et al., Acoustic Model Training Based on Weight Boundary Model for Discrete Deep Neural Networks, Proceedings of The 46th Meeting of Special Interest Group on AI Challenges, Japanese Society for Artificial Intelligence, Nov. 9, 2016, p. 2-11, w/English Machine Translation.

* cited by examiner

IRREVERSIBLE COMPRESSION OF NEURAL NETWORK OUTPUT

CROSS-REFERENCE TO RELATED APPLICATIONS

This application is based upon and claims the benefit of priority from Japanese Patent Application No. 2017-158389, filed on Aug. 21, 2017; the entire contents of which are incorporated herein by reference.

FIELD

Embodiments described herein relate generally to an information processing apparatus, an information processing method, and a computer program product.

BACKGROUND

A neural network is formed of an input layer, a hidden layer, and an output layer. The hidden layer is often implemented by a plurality of layers. Feature amount data calculated in a certain hidden layer serves as an input of a next hidden layer or an output layer. At this time, the feature amount data that is a computation result of the hidden layer is input and output between layers. In the recent neural network, several hidden layers are connected and a deep network is established in many cases. Thus, a data amount of the feature amount data input and output between layers becomes enormous. In an inference apparatus that executes inference using such a neural network, transfer of the feature amount data makes a bandwidth tight, and a large amount of memory is required for saving the feature amount data. Therefore, reduction in the feature amount data is desired.

DETAILED DESCRIPTION

According to an embodiment, an information processing apparatus includes a computing unit and a compressing unit. The computing unit is configured to execute computation of an input layer, a hidden layer, and an output layer of a neural network. The compressing unit is configured to irreversibly compress output data of at least a part of the input layer, the hidden layer, and the output layer and output the compressed data.

Preferred embodiments of an information processing apparatus will now be described in detail with reference to the accompanying drawings. The following describes an example in which an information processing apparatus is implemented as an inference apparatus that performs inference using a neural network.

First Embodiment

There has been known a technique in which a weight vector used in processing a hidden layer of a learned neural network is quantized and a data amount of the weight vector is reduced. With this technique, feature amount data that is a computation result of a hidden layer cannot be reduced. An inference apparatus according to a first embodiment reduces a data amount by compressing (quantizing and the like) feature amount data.

Figure 1:
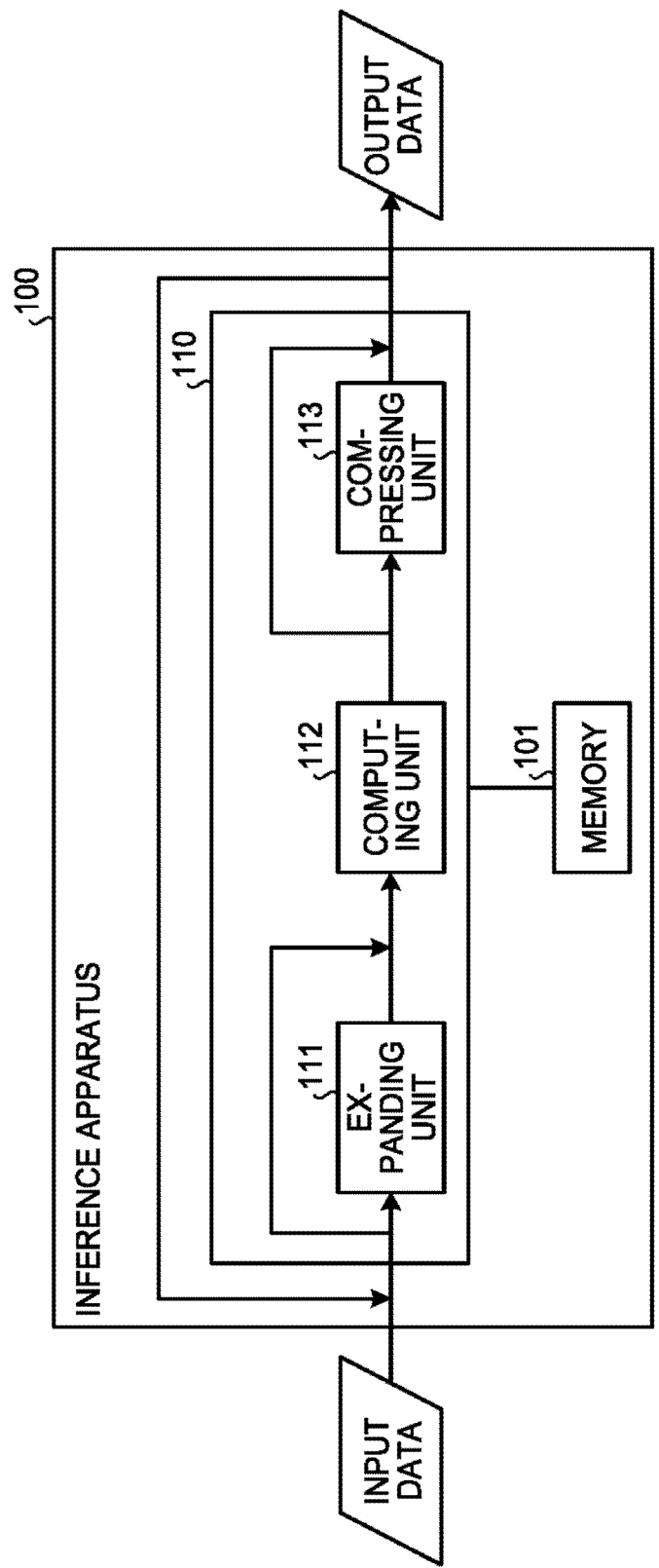
FIG. 1 is a block diagram illustrating an inference apparatus according to a first embodiment.

FIG. 1 is a block diagram illustrating a configuration example of an inference apparatus 100 according to the first embodiment. As illustrated in FIG. 1, the inference apparatus 100 includes an inferring unit 110 and a memory 101. The inferring unit 110 includes an expanding unit 111, a computing unit 112, and a compressing unit 113.

Each of the units (the expanding unit, the computing unit, and the compressing unit) is implemented by, for example, one or a plurality of processors. For example, each of the units may be implemented by causing a processor such as a central processing unit (CPU) to execute a computer program, in other words, may be implemented by software. Each of the units may be implemented by processor such as a dedicated integrated circuit (IC), in other words, may be implemented by hardware. Each of the units may be implemented by using software and hardware together. When a plurality of processors are used, each processor may implement one of the units or may implement two units or more.

The memory 101 temporarily stores various kinds of data used in various kinds of processing performed by the inference apparatus 100, for example. The memory 101 can be formed of any storage medium that is generally used such as a static random access memory (SRAM). The memory 101 may be implemented by physically one storage medium, or may be implemented by a plurality of storage media that are physically different from each other. The memory 101 may be formed on the same hardware as at least one of the units (the expanding unit 111, the computing unit 112, and the compressing unit 113) of the inferring unit 110.

The expanding unit 111 expands compressed data, and outputs the expanded data. The compressed data indicates irreversibly compressed data.

The computing unit 112 performs predetermined computation on data input as an object to be computed (computation data), and outputs output data that is a computation result. Hereinafter, the output data by the computing unit 112 may be referred to as feature amount data. The predetermined computation performed by the computing unit 112 is computation that forms a part or all of the layers (an input layer, a hidden layer, and an output layer) of a neural network. Examples of the predetermined computation include convolution processing, activation function processing, pooling processing (subsampling processing), unpooling processing (upsampling processing), and normalization processing. In addition, the examples also include processing that is not exemplified here.

The compressing unit 113 compresses feature amount data of at least a part of the layers out of the input layer, the hidden layer, and the output layer of the neural network, and outputs the compressed data. The compressing processing performed by the compressing unit 113 is irreversibly compressing processing. Any method depending on characteristics of the feature amount data may be used in the irreversibly compressing processing performed by the compressing unit 113.

For example, when data to be inferred that is input in the inference apparatus 100 is an image, feature amount data output by the computing unit 112 can be recognized as image data of a plurality of channels. Thus, the feature amount data may be divided as two-dimensional data for each channel, and the two-dimensional data may be irreversibly compressed using an image compression method such as joint photographic experts group (JPEG). For example, when data to be inferred that is input in the inference apparatus 100 is voice, feature amount data output by the computing unit 112 can be recognized as voice data of a plurality of channels. Thus, the feature amount data may be divided as one-dimensional data for each channel, and the one-dimensional data may be irreversibly compressed with a voice compression method such as advanced audio coding (AAC). For example, the feature amount data may be simply quantized without using the characteristics described as above and be irreversibly compressed, or may be performed with an irreversible compression method, which is not exemplified in the embodiment.

The following describes an example of operation of the inferring unit 110. The inferring unit 110 receives at least one of the data to be inferred, the feature amount data, and the compressed data that are input in the inference apparatus 100 as input data. The data to be inferred may be compressed with a method with which the expanding unit 111 can expand.

When data input in the inferring unit 110 is non-compressed data, the input data is set to be computation data of the computing unit 112. When data input in the inferring unit 110 is compressed data, expanded data that is the input data expanded by the expanding unit 111 is set to be computation data of the computing unit 112.

The computing unit 112 performs predetermined computation on the input computation data, and outputs feature amount data.

When data output by the inferring unit 110 is non-compressed data, feature amount data is set to be output data of the inferring unit 110. When data output by the inferring unit 110 is compressed data, compressed data obtained by compressing feature amount data output by the computing unit 112 in the compressing unit 113 is set to be output data of the inferring unit 110.

The inferring unit 110 determines in advance whether input data is compressed and whether to compress output data, for example, for every executed computation on each layer, and determines, based on the rule, whether input data is compressed and whether to set output data to be compressed data. For example, the inferring unit 110 may acquire both a parameter used in computation on each layer and information indicating whether compression is made, and execute the determination with reference to this information. After including information indicating whether compression is made in a header and the like of data, the inferring unit 110 may execute the determination with reference to this information.

The computing unit 112 does not need to compress input data or output data (feature amount data) in all executed computation that the computing unit 112 performs, and may compress the input data or the output data in at least a part of the computation. For example, out of layers of the neural network, compression may be executed on a layer having a larger compression effect and on a layer having a smaller effect on identification processing at a later stage.

Compressing feature amount data can make a bandwidth for transferring the feature amount data smaller. Output data may be stored in the memory 101. In the present embodiment, the feature amount data can be compressed, which can reduce the size of the memory 101.

Figure 2:
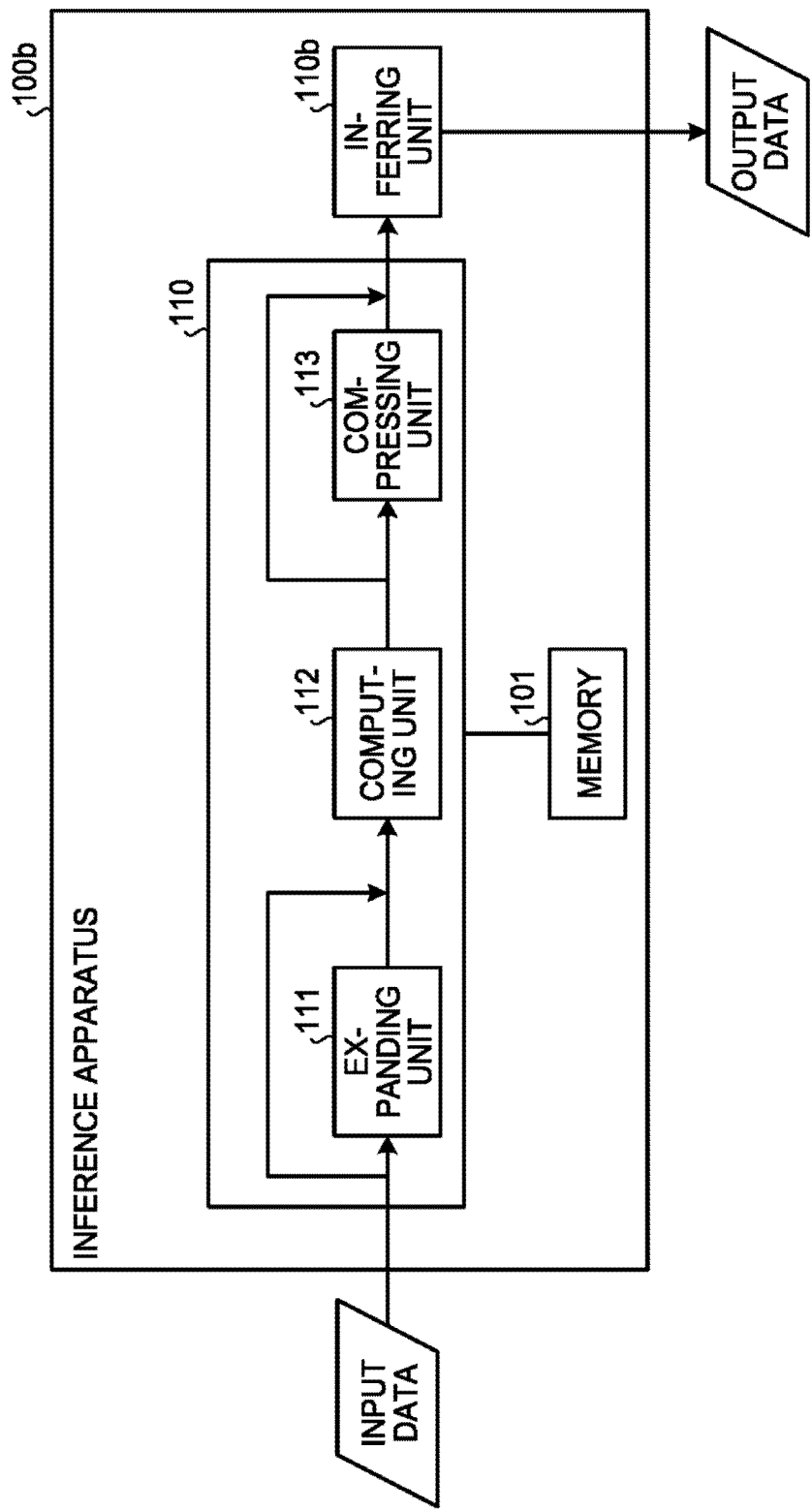
FIG. 2 is a block diagram illustrating an inference apparatus that includes another inferring unit.

As illustrated in FIG. 1, output data of the inferring unit 110 may be re-input in the inferring unit 110. For example, the inferring unit 110 (computing unit 112) further executes, using the re-input data as computation data, computation on a layer positioned after a layer corresponding to the already executed computation. If computation is not repeated using output data of the inferring unit 110 as computation data, the output data does not need to be re-input. Output data may be input in another inferring unit performing the same operation as the inferring unit 110 does. FIG. 2 is a block diagram illustrating a configuration example of an inference apparatus 100b that includes another inferring unit 110b. For example, the inferring unit 110b performs computation on a layer after a layer corresponding to the inferring unit 110. Such a configuration can implement a data flow in which output of the N-th hidden layer is an input of the (N+1)-th hidden layer in the neural network.

Figure 3:
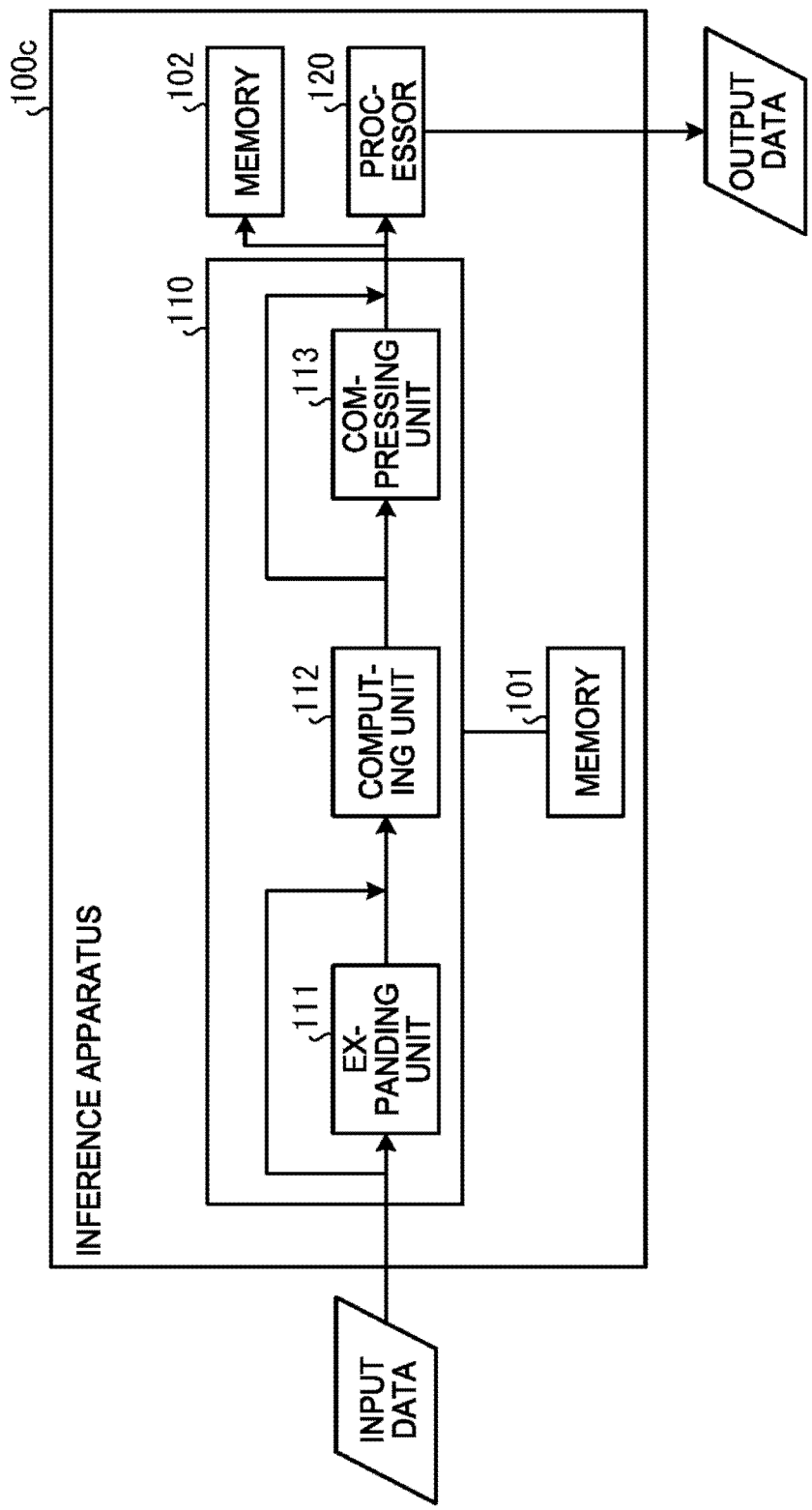
FIG. 3 is a block diagram illustrating an inference apparatus that includes a processor and a memory.

Output data of the inferring unit 110 may be input in a processor that performs processing different from processing of the inferring unit 110 and in a memory different from the memory 101. FIG. 3 is a block diagram illustrating a configuration example of an inference apparatus 100c that is formed in this manner. A processor 120 performs identification processing, for example, based on feature amount data output by the inferring unit 110. The processor 120 may execute processing other than the identification processing. A memory 102 stores therein, for example, data processed by each unit in the inference apparatus 100c that includes the inferring unit 110 and the processor 120. The memory 102 can be formed of, any storage medium that is generally used such as a dynamic random access memory (DRAM).

Figure 4:
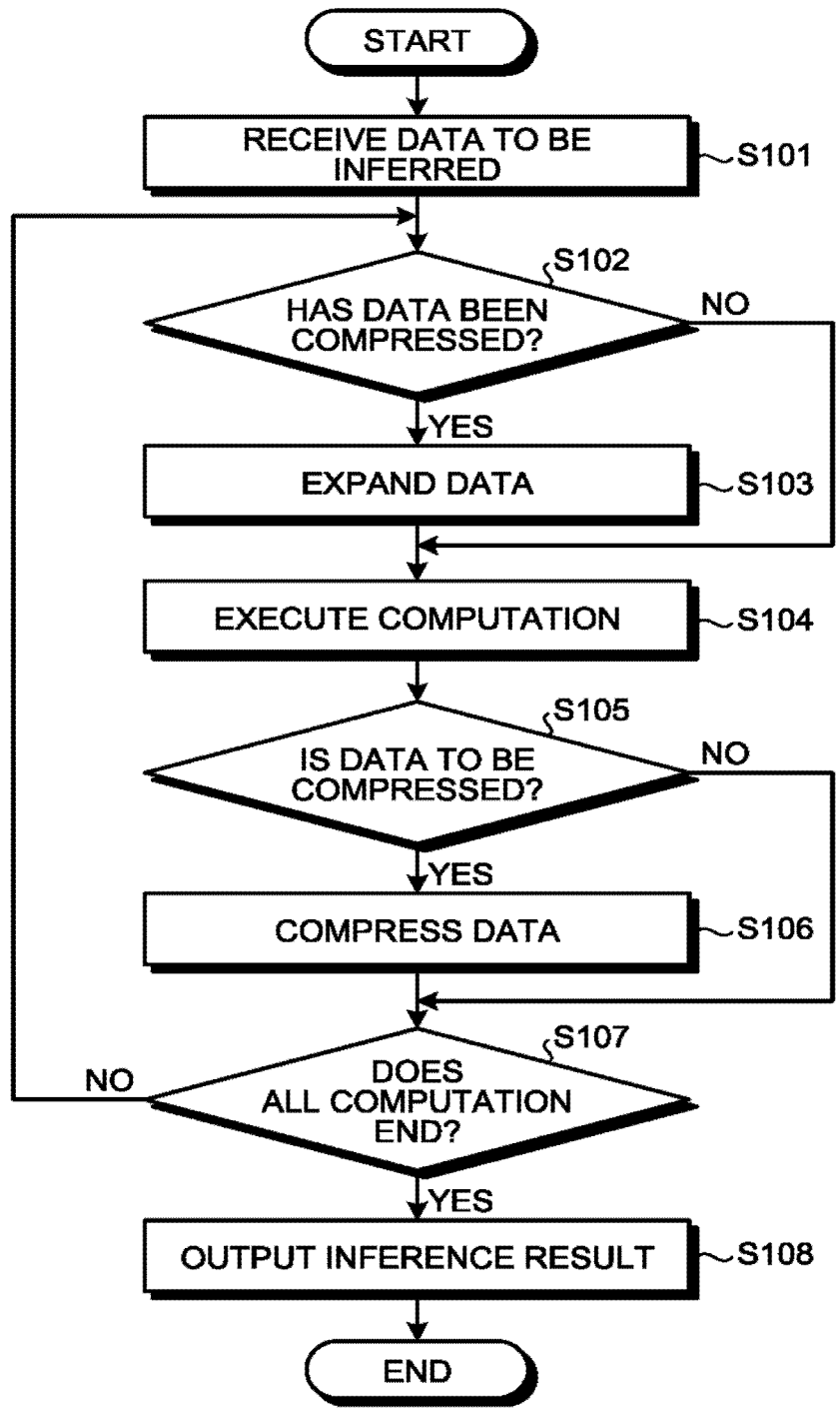
FIG. 4 is a flowchart illustrating inference processing according to the first embodiment.

The following describes inference processing that is performed by the inference apparatus 100 according to the first embodiment formed in this manner, with reference to FIG. 4. FIG. 4 is a flowchart illustrating an example of inference processing according to the first embodiment.

First, the inference apparatus 100 receives input of data to be inferred (Step S101). The data to be inferred is input data of the inferring unit 110. The inferring unit 110 determines whether the input data is compressed data or non-compressed data (Step S102). When the input data is compressed data (Yes at Step S102), the expanding unit 111 expands the compressed input data and outputs the expanded data (Step S103).

When the input data is compressed data, the computing unit 112 executes computation using the expanded data as computation data (Step S104). When the input data is non-compressed data (No at Step S102), the computing unit 112 executes computation using the input data as computation data (Step S104). The computing unit 112 outputs feature amount data that is an execution result of the computation.

The inferring unit 110 determines whether the output data of the inferring unit 110 is set to be compressed data or as non-compressed data (Step S105). When the output data of the inferring unit 110 is set to be compressed data (Yes at Step S105), the compressing unit 113 compresses feature amount data and outputs the compressed data (Step S106).

When the output data of the inferring unit 110 is set to be compressed data, the compressed data is output as output data of the inferring unit 110. When the output data of the inferring unit 110 is set to be non-compressed data (No at Step S105), non-compressed feature amount data is output as output data of the inferring unit 110.

The inferring unit 110 determines whether all computation ends (Step S107). For example, the inferring unit 110 determines whether all computation of a certain layer out of the layers in the neural network ends. When all computation does not end (No at Step S107), output data of the inferring unit 110 is re-input in the inferring unit 110 and the processing is repeated from Step S102.

When all computation ends (Yes at Step S107), output data of the inferring unit 110 is output as an inference result of the inference apparatus 100 (Step S108), and the inference processing is ended.

In this manner, the inference apparatus according to the first embodiment can execute inference processing even when feature amount data generated in the middle of the inference processing has been compressed. In addition, at least a part of the feature amount data is compressed, thereby reducing a data transfer amount for the feature amount data and reducing a memory area.

Second Embodiment

In the first embodiment, when inference processing is executed using a learned neural network (which is also referred to as forward propagation, in other words, a forward path), feature amount data is compressed (for example, quantized) and is expanded (for example, inversely quantized). Thus, an error (quantization error) may occur between feature amount data before compression and feature amount data after compression and expansion, and performance of the neural network may be deteriorated.

In the second embodiment, feature amount data is also compressed and expanded at the time of learning the neural network. An inference apparatus according to the second embodiment executes inference processing using the neural network learned in this manner. Thus, performance of the neural network can be restrained from being deteriorated and a data amount of the feature amount data can be reduced.

Figure 5:
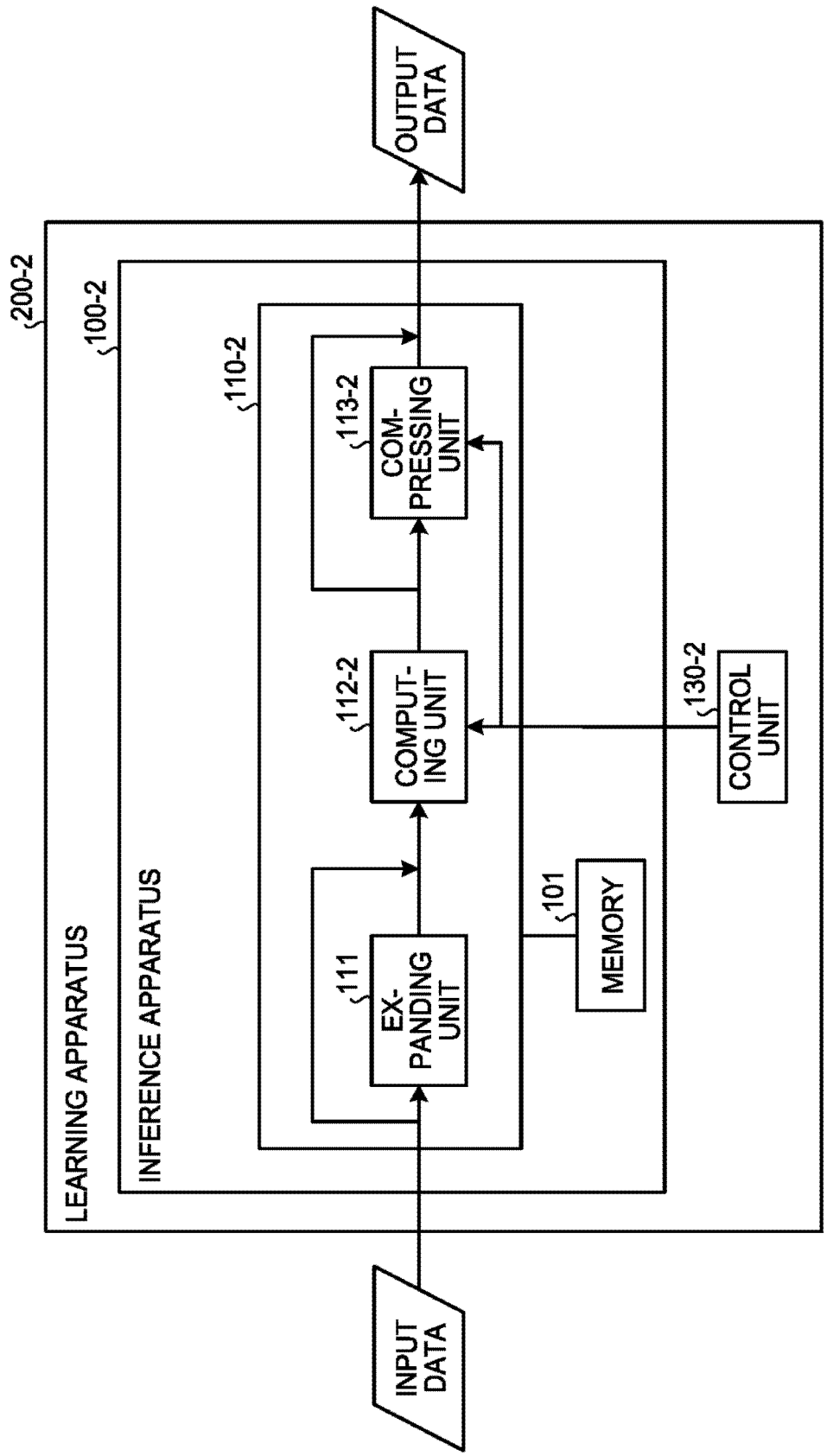
FIG. 5 is a block diagram illustrating a learning apparatus according to a second embodiment.

FIG. 5 is a block diagram that illustrates an example of the configuration of a learning apparatus 200-2 including an inference apparatus 100-2 according to the second embodiment. As illustrated in FIG. 5, the learning apparatus 200-2 includes the inference apparatus 100-2 and a control unit 130-2. The inference apparatus 100-2 includes an inferring unit 110-2 and the memory 101. The inferring unit 110-2 includes the expanding unit 111, a computing unit 112-2, and a compressing unit 113-2.

The second embodiment uses the learning apparatus 200-2 that includes both the inference apparatus 100-2 and the control unit 130-2 controlling the learning of the neural network used in the inference apparatus 100-2. The apparatus configuration is not limited to an example illustrated in FIG. 5. For example, there may be formed an apparatus (information processing apparatus) that has a function of the inference apparatus 100-2 and a function of the learning apparatus 200-2 (control unit 130-2). In the inference apparatus 100-2 according to the second embodiment, functions of the computing unit 112-2 and the compressing unit 113-2 in the inferring unit 110-2 are different from those in the first embodiment. Because the other configurations and functions are the same as those in FIG. 1 that is the block diagram illustrating the inference apparatus 100 according to the first embodiment, like reference numerals are assigned and the explanation is omitted.

The computing unit 112-2 is different from the computing unit 112 of the first embodiment in that a parameter for computation is controlled by the control unit 130-2. The compressing unit 113-2 is different from the compressing unit 113 of the first embodiment in that a parameter for compression is controlled by the control unit 130-2.

The control unit 130-2 controls learning of the neural network used in inference processing by the inference apparatus 100-2. For example, the control unit 130-2 controls, regarding a layer where output data is compressed by the compressing unit 113-2, learning of the neural network, with compressed data as an output. The control unit 130-2 controls learning of a parameter used in controlling the computing unit 112-2 and the compressing unit 113-2. For example, the control unit 130-2 updates a parameter used in controlling the computing unit 112-2 and the compressing unit 113-2.

Examples of a parameter used in controlling the computing unit 112-2 include a convolution coefficient used in performing convolution processing, and a scale amount and a shift amount used in performing normalization processing. Examples of a parameter used in controlling the compressing unit 113-2 include a target compression rate and a quality factor for determining compression efficiency of JPEG compression. The parameter is not limited to them.

Any method may be applied as a method with which the control unit 130-2 learns and updates a parameter. Examples of the method include an error backward propagation method using a method for batch gradient descent, a method for probabilistic gradient descent, and a method for mini batch gradient descent.

The control unit 130-2 may update only one of the parameters used in controlling the computing unit 112-2 and controlling the compressing unit 113-2. In addition, the control unit 130-2 may update only part of parameters of the layers that form the neural network.

Figure 6:
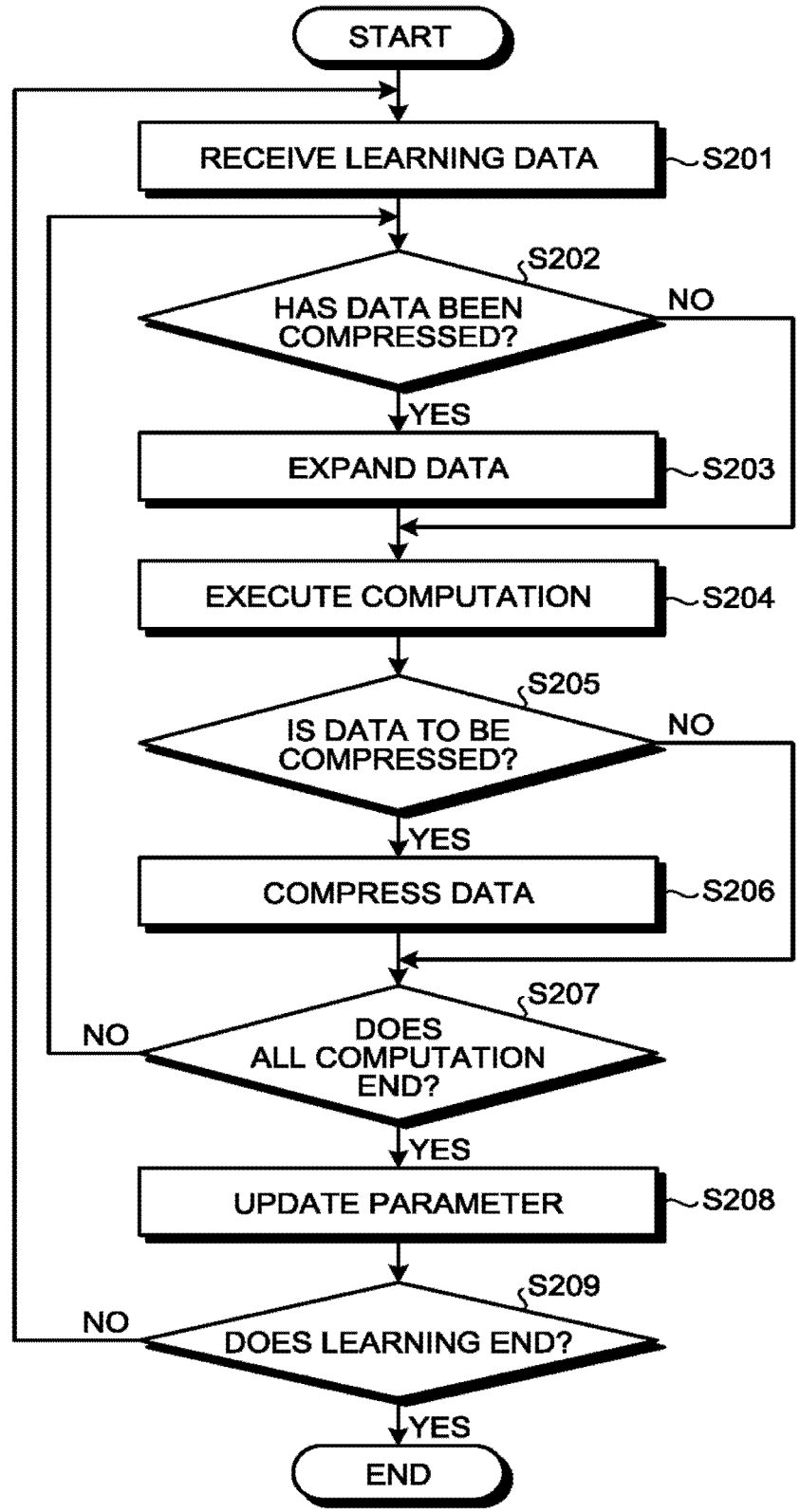
FIG. 6 is a flowchart illustrating learning processing according to the second embodiment.

The following describes learning processing that is performed by the learning apparatus 200-2 according to the second embodiment formed in this manner, with reference to FIG. 6. FIG. 6 is a flowchart illustrating an example of learning processing according to the second embodiment.

The learning apparatus 200-2 receives input of learning data (Step S201). The learning data serves as input data of the inference apparatus 100-2, in other words, data to be inferred by the inference apparatus 100-2.

Because the processing from Step S202 to Step S207 is the same as the processing from Step S102 to Step S107 in the inference apparatus 100 according to the first embodiment, the explanation is omitted. In other words, the same inference processing as the processing in FIG. 4 is executed using the input learning data as data to be inferred.

When all computation is determined to end at Step S207 (Yes at Step S207), the control unit 130-2 updates a parameter used in controlling the computing unit 112-2 and the compressing unit 113-2 based on an inference result output by the inference apparatus 100-2 (Step S208).

The control unit 130-2 determines whether learning ends (Step S209). For example, the control unit 130-2 determines the end of learning by determining whether an error is sufficiently reduced, whether the number of times of learning has reached a threshold, whether processing is completed on all learning data, and the like.

When learning does not end (No at Step S209), new learning data is input in the learning apparatus 200-2, and the processing is repeated. When learning ends (Yes at Step S209), the control unit 130-2 finalizes an updated parameter.

As described above, according to the second embodiment, the neural network that is learned in the learning apparatus 200-2 including the inference apparatus 100-2 can be used.

The inference apparatus 100-2 has a function of irreversibly compressing feature amount data. The learning apparatus 200-2 can learn the neural network in which feature amount data is irreversibly compressed. In other words, the configuration of the neural network used by the inference apparatus 100-2 for inference processing is the same as the configuration of the neural network used by the learning apparatus for learning processing.

Considering a change in feature amount data due to irreversible compression, the learning apparatus 200-2 can learn a parameter of each layer forming the neural network, and can learn compression efficiency of compression processing so that the change in feature amount data should hardly influence a learning result. Thus, the neural network learned by the learning apparatus 200-2 can restrain deterioration in performance of the neural network due to irreversible compression. The inference apparatus 100-2 that uses the learned neural network can restrain deterioration in performance due to irreversible compression and reduce a data amount of feature amount data.

The first and second embodiments may be implemented by a computer program and the like having each function, or may be implemented by a general CPU and the like. A function (control unit 130-2) related to learning in the learning apparatus 200-2 may be implemented by a computer program through a general CPU and the like, and the inference apparatus 100-2 may be implemented by dedicated hardware (dedicated IC and the like).

As described above, the first and second embodiments can reduce a data amount of feature amount data.

Figure 7:
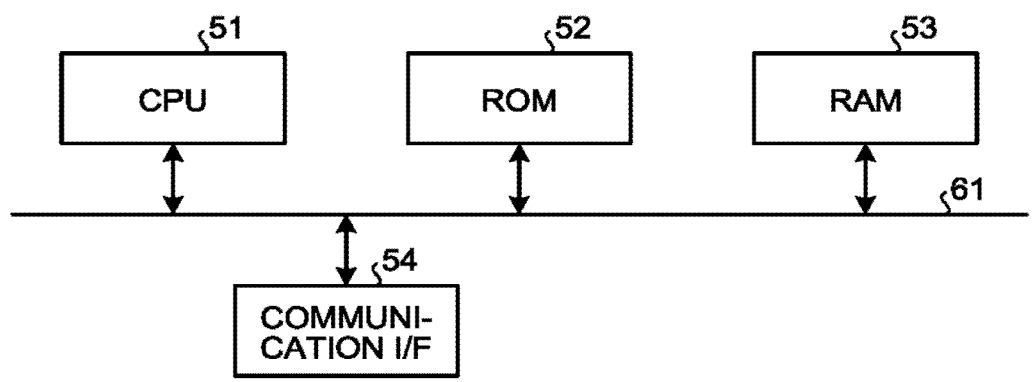
FIG. 7 is a hardware configuration diagram of an apparatus according to the first or second embodiment.

The following describes the hardware configuration of the apparatus (the inference apparatus and the learning apparatus) according to the first or second embodiment, with reference to FIG. 7. FIG. 7 is an explanatory view illustrating a hardware configuration example of the apparatus according to the first or second embodiment.

The apparatus according to the first or second embodiment includes a control apparatus such as a central progressing unit (CPU) 51, a storage apparatus such as a read only memory (ROM) 52 and a random access memory (RAM) 53, a communication interface (I/F) 54 that connects to a network and performs communication, and a bus 61 that connects each unit.

A computer program executed in the apparatus according to the first or second embodiment is incorporated in the ROM 52 and the like in advance, so as to be provided.

The computer program executed in the apparatus according to the first or second embodiment may be a file in an installable format or in an executable format, and may be recorded in computer-readable recording media such as a compact disc read only memory (CD-ROM), a flexible disk (FD), a compact disc recordable (CD-R), and a digital versatile disc (DVD) so as to be provided as a computer program product.

The computer program executed in the apparatus according to the first or second embodiment may be stored in a computer connected to a network such as the Internet and be downloaded through the network so as to be provided. The computer program executed in the apparatus according to the first or second embodiment may be provided or distributed through a network such as the Internet.

The computer program executed in the apparatus according to the first or second embodiment enables a computer to function as each unit of the apparatus described above. In this computer, the CPU 51 can load the computer program on the main memory apparatus from a computer-readable storage medium and execute the computer program.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing apparatus comprising:
one or more hardware processors configured to:
execute computation of an input layer, a hidden layer, and an output layer of a neural network;
irreversibly compress output data of one or more layers that are determined to be compressed based on pieces of information, each piece of the information indicating whether compression is made to corresponding one of a plurality of layers including the input layer, the hidden layer, and the output layer; and
output the compressed data, wherein
the hardware processors are configured to:
irreversibly compress two-dimensional data using an image compression method that includes joint photographic experts group (JPEG) when data input in the input layer is an image of a plurality of channels, the two-dimensional data being obtained by dividing the output data for each of the plurality of channels; and
irreversibly compress one-dimensional data using a voice compression method that includes advanced audio coding (AAC) when data input in the input layer is a voice of a plurality of channels, the one-dimensional data being obtained by dividing the output data for each of the plurality of channels.

2. The apparatus according to claim 1, wherein the hardware processors are configured to control learning of the neural network using the compressed data as an output for a layer where output data is compressed.

3. The apparatus according to claim 2, wherein the hardware processors control learning of a parameter used in controlling the computation.

4. The apparatus according to claim 2, wherein the hardware processors control learning of a parameter used in controlling the compression.

5. The apparatus according to claim 1, wherein the hardware processors are configured to
expand the compressed data and output the expanded data, and
execute, when input data is not compressed, the computation on the input data, and execute, when input data is compressed, the computation on the expanded data obtained by expanding the input data.

6. The apparatus according to claim 1, wherein,
when output data is not compressed, the output data is set to be an output of a corresponding layer, and
when output data is compressed, the compressed data obtained by compressing the output data is set to be an output of a corresponding layer.

7. An information processing method comprising:
executing computation of an input layer, a hidden layer, and an output layer of a neural network;
irreversibly compressing output data of one or more layers that are determined to be compressed based on pieces of information, each piece of the information indicating whether compression is made to corresponding one of a plurality of layers including the input layer, the hidden layer, and the output layer; and outputting compressed data, wherein the compressing includes:

irreversibly compressing two-dimensional data using an image compression method that includes joint photographic experts group (JPEG) when data input in the input layer is an image of a plurality of channels, the two-dimensional data being obtained by dividing the output data for each of the plurality of channels; and irreversibly compressing one-dimensional data using a voice compression method that includes advanced audio coding (AAC) when data input in the input layer is a voice of a plurality of channels, the one-dimensional data being obtained by dividing the output data for each of the plurality of channels.

8. A computer program product having a non-transitory computer readable medium including programmed instructions stored thereon, wherein the instructions, when executed by a computer, cause the computer to perform:

executing computation of an input layer, a hidden layer, and an output layer of a neural network;

irreversibly compressing output data of one or more layers that are determined to be compressed based on pieces of information, each piece of the information indicating whether compression is made to corresponding one of a plurality of layers including the input layer, the hidden layer, and the output layer; and outputting compressed data, wherein the compressing includes:

irreversibly compressing two-dimensional data using an image compression method that includes joint photographic experts group (JPEG) when data input in the input laver is an image of a plurality of channels, the two-dimensional data being obtained by dividing the output data for each of the plurality of channels; and irreversibly compressing one-dimensional data using a voice compression method that includes advanced audio coding (AAC) when data input in the input layer is a voice of a plurality of channels, the one-dimensional data being obtained by dividing the output data for each of the plurality of channels.

\* \* \* \* \*